United States Patent
Yamazawa

(10) Patent No.: US 9,953,811 B2
(45) Date of Patent: Apr. 24, 2018

(54) PLASMA PROCESSING METHOD

(71) Applicant: TOKYO ELECTRON LIMITED, Tokyo (JP)

(72) Inventor: Yohei Yamazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 863 days.

(21) Appl. No.: 14/325,457

(22) Filed: Jul. 8, 2014

(65) Prior Publication Data
US 2015/0014276 A1 Jan. 15, 2015

Related U.S. Application Data

(62) Division of application No. 13/434,802, filed on Mar. 29, 2012, now abandoned.
(Continued)

(30) Foreign Application Priority Data

Mar. 29, 2011 (JP) ................... 2011-072582

(51) Int. Cl.
*H01L 21/306* (2006.01)
*C23C 16/00* (2006.01)
(Continued)

(52) U.S. Cl.
CPC ........ *H01J 37/32697* (2013.01); *H01J 37/02* (2013.01); *H01J 37/321* (2013.01);
(Continued)

(58) Field of Classification Search
CPC ................. H01J 37/321; H01J 37/3211; H01J 37/32119; H01J 37/32128;
(Continued)

(56) References Cited

U.S. PATENT DOCUMENTS 5,800,619 A 9/1998 Holland et al.
6,093,457 A 7/2000 Okumura et al.
(Continued)

FOREIGN PATENT DOCUMENTS

CN 101583234 11/2009
CN 101583234 A 11/2009
(Continued)

*Primary Examiner* — Luz L Alejandro Mulero
(74) *Attorney, Agent, or Firm* — Brundidge & Stanger, P.C.

(57) ABSTRACT

A plasma processing method for performing a plasma process on a processing target substrate is provided. The plasma processing method includes: segmenting a RF antenna into an inner coil, an intermediate coil, and an outer coil with gaps therebetween in a radial direction, respectively, the inner coil, the intermediate coil and the outer coil being electrically connected to one another in parallel between a first node and a second node; providing a variable intermediate capacitor and a variable outer capacitor between the first node and the second node, the variable intermediate capacitor being electrically connected in series to the intermediate coil, the variable outer capacitor being electrically connected in series to the outer coil, no reactance device being connected to the inner coil; and controlling plasma density distribution on the processing target substrate by selecting or variably adjusting electrostatic capacitances of the intermediate capacitor and the outer capacitor.

9 Claims, 10 Drawing Sheets

Related U.S. Application Data

(60) Provisional application No. 61/472,671, filed on Apr. 7, 2011.

(51) Int. Cl.
*H01J 37/32* (2006.01)
*H01J 37/02* (2006.01)

(52) U.S. Cl.
CPC ....... *H01J 37/3211* (2013.01); *H01J 37/3244* (2013.01); *H01J 37/32119* (2013.01); *H01J 37/32137* (2013.01); *H01J 37/32174* (2013.01); *H01J 2237/327* (2013.01); *H01J 2237/3341* (2013.01)

(58) Field of Classification Search
CPC ........... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | |
|---|---|---|
| 6,164,241 A | 12/2000 | Chen et al. |
| 6,441,555 B1 | 8/2002 | Howald et al. |
| 6,685,798 B1 | 2/2004 | Holland et al. |
| 2001/0000898 A1* | 5/2001 | Qian ..................... H01J 37/321 219/121.43 |
| 2002/0130110 A1* | 9/2002 | Kwon ................... H01J 37/321 219/121.54 |
| 2003/0067273 A1 | 4/2003 | Benjamin et al. |
| 2004/0083971 A1 | 5/2004 | Holland |
| 2010/0243162 A1 | 9/2010 | Koshimizu |

FOREIGN PATENT DOCUMENTS

| | | |
|---|---|---|
| CN | 101853764 | 10/2010 |
| CN | 101853764 A | 10/2010 |
| JP | 2002124399 A | 4/2002 |
| JP | 2006221852 A | 8/2006 |
| JP | 2009277859 A | 11/2009 |
| JP | 2010135298 A | 6/2010 |
| JP | 2010238981 A | 10/2010 |
| KR | 1020000053680 A | 9/2000 |
| KR | 1020100109492 A | 10/2010 |

\* cited by examiner

CURRENT DENSITY DISTRIBUTION IN DONUT-SHAPED PLASMA

PLASMA DENSITY DISTRIBUTION

CURRENT DENSITY DISTRIBUTION IN DONUT-SHAPED PLASMA

PLASMA DENSITY DISTRIBUTION

PLASMA PROCESSING METHOD

CROSS-REFERENCE TO RELATED APPLICATION

This is a divisional application of U.S. patent application Ser. No. 13/434,802, filed on Mar. 29, 2012 which claims the benefit of Japanese Patent Application No. 2011-072582 filed on Mar. 29, 2011 and U.S. Provisional Application No. 61/472,671 filed on Apr. 7, 2011, the entire disclosures of which are incorporated herein by reference.

FIELD OF THE INVENTION

The present disclosure relates to a technique for performing a plasma process on a processing target substrate; and, more particularly, to an inductively coupled plasma processing apparatus and a plasma processing method.

BACKGROUND OF THE INVENTION

In a manufacturing process of a semiconductor device or a FPD (Flat Panel Display), plasma is used to perform a process, such as etching, deposition, oxidation or sputtering, so as to perform a good reaction of a processing gas at a relatively low temperature. Conventionally, plasma generated by a high frequency electric discharge in MHz frequency band has been used in this kind of plasma process. The plasma generated by the high frequency electric discharge is largely divided into capacitively coupled plasma and inductively coupled plasma according to a plasma generation method (in view of an apparatus).

Generally, in an inductively coupled plasma processing apparatus, at least a part (for example, a ceiling) of walls of a processing chamber may have a dielectric window, and a high frequency power is supplied to a coil-shaped RF antenna positioned at an outside of this dielectric window. The processing chamber serves as a depressurizable vacuum chamber, and a target substrate (for example, a semiconductor wafer and a glass substrate) is provided at a central region within the chamber. A processing gas is supplied into a processing space formed between the dielectric window and the substrate. A high frequency AC magnetic field having magnetic force lines is generated around the RF antenna by a high frequency current flowing in the RF antenna. The magnetic force lines of the high frequency AC magnetic field are transmitted to the processing space within the chamber via the dielectric window. As the RF magnetic field of the high frequency AC magnetic field changes with time, an inductive electric field is generated in an azimuth direction within the processing space. Then, electrons accelerated by this inductive electric field in the azimuth direction collide with molecules or atoms of the processing gas so as to be ionized. In this process, donut-shaped plasma may be generated.

Since a large processing space is formed within the chamber, the donut-shaped plasma can be diffused efficiently in all directions (particularly, in a radial direction) and a plasma density on the substrate becomes very uniform. However, only with a conventional RF antenna, the plasma density on a substrate is not sufficiently uniform for most plasma processes. In the plasma process, it is also one of the important issues to improve uniformity of a plasma density on a substrate since a uniformity/reproducibility and a production yield of a plasma process depend on the plasma uniformity.

In the inductively coupled plasma processing apparatus, a characteristic (profile) of plasma density distribution within the donut-shaped plasma formed in the vicinity of the dielectric window within the chamber is important. Especially, the profile of the plasma density distribution affects characteristics (especially, uniformity) of plasma density distribution on the substrate after the diffusion of the plasma.

In this regard, there have been proposed several methods for improving uniformity of plasma density distribution in a diametrical direction by dividing the RF antenna into a multiple number of circular ring-shaped coils each having different diameter. There are two types of RF antenna division methods: a first type of connecting the multiple number of circular ring-shaped coils in series (see, for example, Patent Document 1) and a second type of connecting the multiple number of circular ring-shaped coils in parallel (see, for example, Patent Document 2).

Patent Document 1: U.S. Pat. No. 5,800,619
Patent Document 1: U.S. Pat. No. 6,164,241

In accordance with the first type method among the aforementioned conventional RF antenna division methods, since an entire coil length of the RF antenna is large as a sum of all the coils, a voltage drop within the RF antenna may be fairly large and not negligible. Further, due to a wavelength effect, a standing wave of electric current having a node in the vicinity of a RF input terminal of the RF antenna may be easily formed. For these reasons, in accordance with this first type method, it may be difficult to achieve uniformity of plasma density distribution in a diametrical direction as well as in a circumferential direction. Thus, the first type method is essentially deemed to be inadequate for a plasma process for which plasma of a large diameter is necessary.

Meanwhile, in accordance with the second type method, the wavelength effect and the voltage drop within the RF antenna depend on a length of each of the coils segmented in parallel. Thus, the voltage drop within the antenna is relatively small. The second type method is advantageous in suppressing the wavelength effect. However, in the second type method, it is difficult to properly control current distribution within the RF antenna in a diametrical direction, and furthermore, the plasma density distribution right below the antenna.

Therefore, in the conventional plasma processing apparatus employing the second type method, variable capacitors for adjusting impedance are additionally added(connected) to respective coils within the RF antenna so as to adjust a ratio of RF currents flowing through the respective coils. However, since the variable capacitors are highly expensive, it is not desirable in costs to use the variable capacitors for all coils within the antenna. As the number of the variable capacitors increases, electrostatic capacitances (parameters) to be adjusted increase. Thus, adjustment works are complicated.

Meanwhile, the conventional methods do not effectively overcome an undesired profile, where the plasma density becomes relatively higher at a central portion of the diametrical direction. Especially, in a low pressure process, the plasma density may become easily higher at the central portion of the diametrical direction as a result of plasma diffusion. This problem is not easily resolved by the conventional methods. In a large-diameter plasma processing apparatus, a difference in a coil diameter between an inner coil and an outer coil is large. Thus, the plasma density strongly tends to become relatively higher at the central portion of the diametrical direction. The conventional methods could not have effectively achieved the uniformity of the plasma density distribution.

BRIEF SUMMARY OF THE INVENTION

In view of the above, the present illustrative embodiments provide an inductively coupled plasma processing apparatus and a plasma processing method, which are capable of effectively and easily controlling plasma density distribution within donut-shaped plasma in a diametrical direction. Especially, it is possible to effectively and variously control the plasma density distribution in the diametrical direction to be a proper profile when a pressure is low or plasma of a large diameter is necessary.

In accordance with one aspect of an illustrative embodiment, there is provided a plasma processing apparatus. The plasma processing apparatus includes a processing chamber having a dielectric window; a substrate holding unit for holding thereon a processing target substrate within the processing chamber; a processing gas supply unit configured to supply a processing gas into the processing chamber in order to perform a plasma process on the processing target substrate; an RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas in the RF antenna. The RF antenna may include an inner coil, an intermediate coil, and an outer coil with gaps therebetween in a radial direction, respectively. Further, the inner coil, the intermediate coil and the outer coil may be electrically connected to one another in parallel between a first node and a second node provided in high frequency transmission lines of the high frequency power supply unit. Furthermore, a variable intermediate capacitor and a variable outer capacitor may be provided between the first node and the second node, and the variable intermediate capacitor may be electrically connected in series to the intermediate coil, and the variable outer capacitor may be electrically connected in series to the outer coil. Moreover, no reactance device may be connected to the inner coil between the first node and the second node.

In accordance with another aspect of the illustrative embodiment, there is provided a plasma processing apparatus. The plasma processing apparatus includes a processing chamber having a dielectric window; a substrate holding unit for holding thereon a processing target substrate within the processing chamber; a processing gas supply unit configured to supply a processing gas into the processing chamber in order to perform a plasma process on the processing target substrate; an RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas in the RF antenna. The RF antenna may include an inner coil, an intermediate coil, and an outer coil with gaps therebetween in a radial direction, respectively. Further, the inner coil, the intermediate coil and the outer coil may be electrically connected to one another in parallel between a first node and a second node provided in high frequency transmission lines of the high frequency power supply unit. Furthermore, a fixed or semi-fixed inner capacitor, a variable intermediate capacitor, and a variable outer capacitor may be provided between the first node and the second node, and the fixed or semi-fixed inner capacitor may be electrically connected to the inner coil. Moreover, the variable intermediate capacitor may be electrically connected in series to the intermediate coil, and the variable outer capacitor may be electrically connected in series to the outer coil.

In accordance with still another aspect of the illustrative embodiment, there is provided a plasma processing apparatus. The plasma processing apparatus includes a processing chamber having a dielectric window; a substrate holding unit for holding thereon a processing target substrate within the processing chamber; a processing gas supply unit configured to supply a processing gas into the processing chamber in order to perform a plasma process on the processing target substrate; an RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas in the RF antenna. The RF antenna may include an inner coil, an intermediate coil, and an outer coil with gaps therebetween in a radial direction, respectively. Further, the inner coil, the intermediate coil and the outer coil may be electrically connected to one another in parallel between a first node and a second node provided in high frequency transmission lines of the high frequency power supply unit. Furthermore, a fixed or semi-fixed inner inductor, a variable intermediate capacitor, and a variable outer capacitor may be provided between the first node and the second node, and the fixed or semi-fixed inner inductor may be electrically connected to the inner coil. Moreover, the variable intermediate capacitor may be electrically connected in series to the intermediate coil, and the variable outer capacitor is electrically connected in series to the outer coil.

In accordance with still another aspect of the illustrative embodiment, there is provided a plasma processing method for performing a plasma process on a processing target substrate by using a plasma processing apparatus. The plasma processing apparatus includes a processing chamber having a dielectric window; a substrate holding unit for holding thereon a processing target substrate within the processing chamber; a processing gas supply unit configured to supply a processing gas into the processing chamber in order to perform a plasma process on the processing target substrate; an RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas in the RF antenna. The plasma processing method includes: segmenting the RF antenna into an inner coil, an intermediate coil, and an outer coil with gaps therebetween in a radial direction, respectively, the inner coil, the intermediate coil and the outer coil being electrically connected to one another in parallel between a first node and a second node provided in high frequency transmission lines of the high frequency power supply unit; providing a variable intermediate capacitor and a variable outer capacitor between the first node and the second node, the variable intermediate capacitor being electrically connected in series to the intermediate coil, the variable outer capacitor being electrically connected in series to the outer coil, no reactance device being connected to the inner coil; and controlling plasma density distribution on the substrate by selecting or variably adjusting electrostatic capacitances of the intermediate capacitor and the outer capacitor.

In the plasma processing apparatus or the plasma processing method, when a high frequency power is supplied from the high frequency power supply unit to the RF antenna, an RF magnetic field is generated around each of the inner coil, the intermediate coil, and the outer coil of the RF antenna by high frequency currents flowing in the respective coils. Further, an inductive electric field configured to generate high frequency electric discharge of the processing gas, i.e., donut-shaped plasma in the processing chamber is formed. The generated donut-shaped plasma is diffused in all directions within the processing chamber, so that the plasma density on the substrate is uniformized.

When directions of the coil currents flowing in the inner coil, the intermediate coil, and the outer coil, respectively, are identical to the circumferential direction, the plasma density within the donut-shaped plasma has a maximum value at portions corresponding to the respective coils. In this case, by varying or adjusting electrostatic capacitances of the intermediate capacitor and the outer capacitor, an intermediate coil current flowing in the intermediate coil and an outer coil current flowing in the outer coil are varied with respect to an inner coil current flowing in the inner coil. In this manner, it is possible to control the plasma density distribution within the donut-shaped plasma, and furthermore, the plasma density distribution on the substrate.

Further, it is possible to flow the intermediate coil current or the outer coil current in a direction opposite to the other coil current by adjusting the electrostatic capacitance of the intermediate capacitor or the electrostatic capacitance of the outer capacitor. In this case, it is possible to locally lower the plasma density at the portion in the donut-shaped plasma, corresponding to the intermediate coil or the outer coil. Furthermore, a freedom degree of the plasma density distribution control on the substrate can be expanded.

In accordance with still another aspect of the illustrative embodiment, there is provided a plasma processing apparatus. The plasma processing apparatus includes a processing chamber having a dielectric window; a substrate holding unit for holding thereon a processing target substrate within the processing chamber; a processing gas supply unit configured to supply a processing gas into the processing chamber in order to perform a plasma process on the processing target substrate; an RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas in the RF antenna. The RF antenna may include an inner coil, an intermediate coil, and an outer coil with gaps therebetween in a radial direction, respectively. Further, the inner coil, the intermediate coil and the outer coil may be electrically connected to one another in parallel between a first node and a second node provided in high frequency transmission lines of the high frequency power supply unit. Furthermore, a variable inner capacitor, a variable intermediate capacitor, and a fixed or semi-fixed outer capacitor may be provided between the first node and the second node, and the variable inner capacitor may be electrically connected to the inner coil. Moreover, the variable intermediate capacitor may be electrically connected in series to the intermediate coil, and the fixed or semi-fixed outer capacitor may be electrically connected in series to the outer coil.

In the plasma processing apparatus, when a high frequency power is supplied from the high frequency power supply unit to the RF antenna, an RF magnetic field is generated around each of the inner coil, the intermediate coil, and the outer coil of the RF antenna by high frequency currents flowing in the respective coils. Further, an inductive electric field configured to generate high frequency electric discharge of the processing gas, i.e., donut-shaped plasma in the processing chamber is formed. The generated donut-shaped plasma is diffused in all directions within the processing chamber, so that the plasma density on the substrate is uniformized.

When directions of the coil currents flowing in the inner coil, the intermediate coil, and the outer coil, respectively, are identical to the circumferential direction, the plasma density within the donut-shaped plasma has a maximum value at a portion corresponding to each of the coils. In this case, by varying or adjusting electrostatic capacitances of the intermediate capacitor and the inner capacitor, an intermediate coil current flowing in the intermediate coil and an inner coil current flowing in the inner coil, respectively, are varied with respect to an outer coil current flowing in the outer coil. In this manner, it is possible to control the plasma density distribution within the donut-shaped plasma, and furthermore, the plasma density distribution on the substrate.

Further, it is possible to flow the intermediate coil current in a direction opposite to the other coil currents by adjusting the electrostatic capacitance of the intermediate capacitor. In this case, it is possible to locally lower the plasma density at a portion in the donut-shaped plasma, corresponding to the intermediate coil or the outer coil. Furthermore, a freedom degree of the plasma density distribution control on the substrate can be expanded.

In accordance with the plasma processing apparatus or the plasma processing method of the illustrative embodiment, it is possible to effectively and easily control the plasma density distribution within the donut-shaped plasma, with the above-described configuration and operation. Especially, it is possible to effectively and variously control the plasma density distribution in the diametrical direction to have a proper profile when a pressure is low or plasma of a large diameter is necessary.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments will be described with reference to the accompanying drawings.

[Entire Configuration and Operation of Apparatus]

Figure 1:
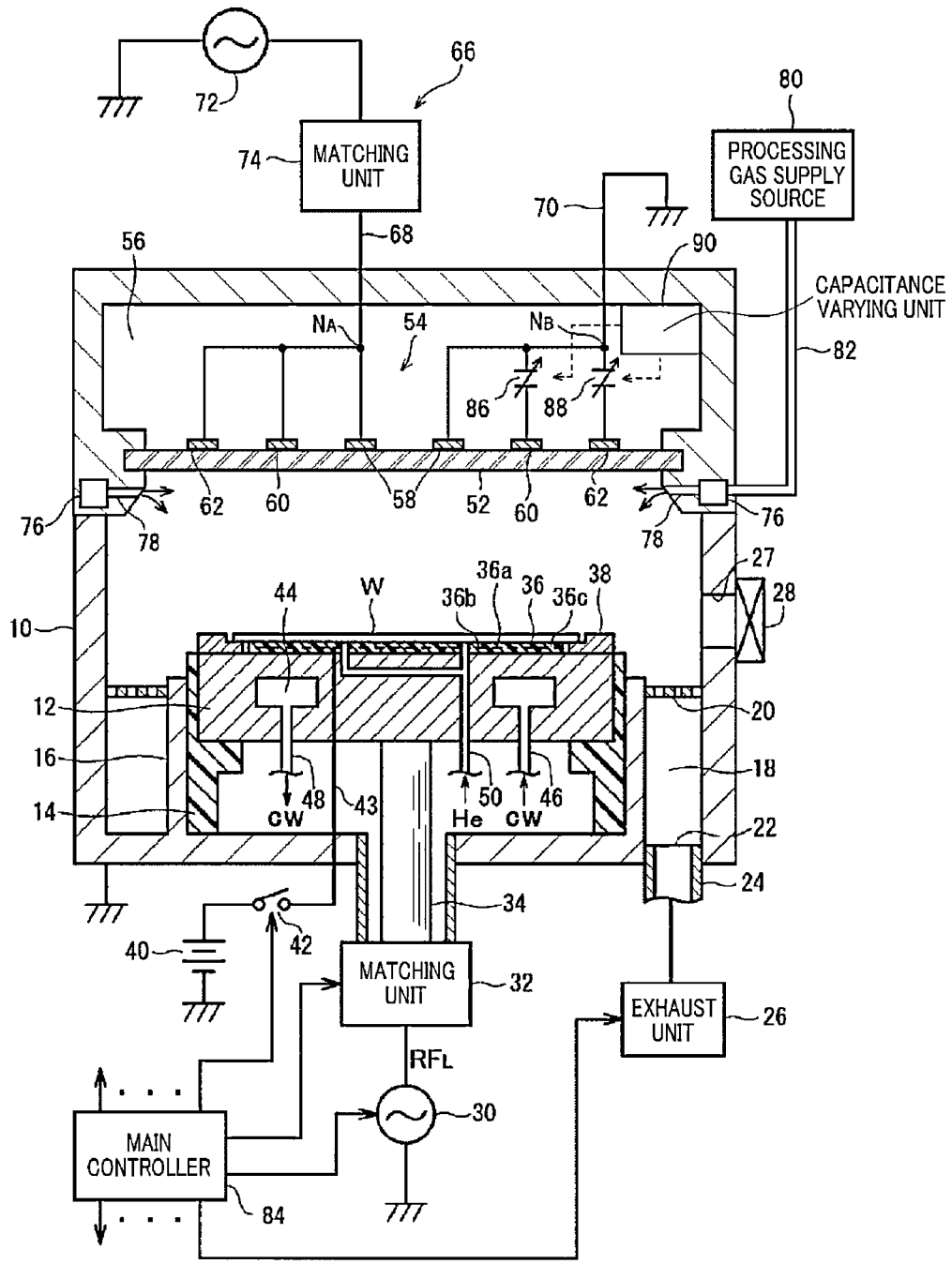
FIG. 1 is a longitudinal cross sectional view showing a configuration of an inductively coupled plasma processing apparatus in accordance with an example of an illustrative embodiment.

FIG. 1 illustrates a configuration of an inductively coupled plasma processing apparatus in accordance with an illustrative embodiment.

The plasma processing apparatus is configured as an inductively coupled plasma etching apparatus using a planar coil RF antenna. By way of example, the plasma etching apparatus may include a cylindrical vacuum chamber (processing chamber) 10 made of metal such as aluminum or stainless steel. The chamber 10 may be frame grounded.

Above all, there will be explained a configuration of each component which is not related to plasma generation in this inductively coupled plasma etching apparatus.

At a lower central region within the chamber 10, a circular plate-shaped susceptor 12 may be provided horizontally. The susceptor 12 may mount thereon a target substrate such as a semiconductor wafer W and may serve as a high frequency electrode as well as a substrate holder. This susceptor 12 may be made of, for example, aluminum and may be supported by a cylindrical insulating support 14 which may be extended uprightly from a bottom of the chamber 10.

Between a cylindrical conductive support 16 which is extended uprightly from a bottom of the chamber 10 along the periphery of the cylindrical insulating support 14 and an inner wall of the chamber 10, an annular exhaust line 18 may be provided. Further, an annular baffle plate 20 may be provided at an upper portion or an input of the exhaust line 18. Further, an exhaust port 22 may be provided at a bottom portion. In order for a gas flow within the chamber 10 to be uniformized with respect to an axis of the semiconductor wafer W on the susceptor 12, multiple exhaust ports 22 equi-spaced from each other along a circumference may be provided. Each exhaust port 22 may be connected to an exhaust unit 26 via an exhaust pipe 24. The exhaust unit 26 may include a vacuum pump such as a turbo molecular pump or the like. Thus, it may be possible to depressurize a plasma generation space within the chamber 10 to a required vacuum level. At an outside of a sidewall of the chamber 10, a gate valve 28 configured to open and close a loading/unloading port 27 of the semiconductor wafer W may be provided.

The susceptor 12 may be electrically connected to a high frequency power supply 30 for RF bias via a matching unit 32 and a power supply rod 34. This high frequency power supply 30 may be configured to output a variable high frequency power $RF_L$ having an appropriate frequency (typically, about 13.56 MHz or less) to control energies of ions attracted into the semiconductor wafer W. The matching unit 32 may accommodate a variable reactance matching circuit for performing matching between an impedance of the high frequency power supply 30 and an impedance of a load (mainly, susceptor, plasma and chamber). The matching circuit may include a blocking capacitor configured to generate a self-bias.

An electrostatic chuck 36 for holding the semiconductor wafer W by an electrostatic attraction force may be provided on an upper surface of the susceptor 12. Further, a focus ring 38 may be provided around the electrostatic chuck 36 to annularly surround the periphery of the semiconductor wafer W. The electrostatic chuck 36 may be formed by placing an electrode 36a made of a conductive film between a pair of insulating films 36b and 36c. A high voltage DC power supply 40 may be electrically connected to the electrode 36a via a switch 42 and a coated line 43. By applying a high DC voltage from the high voltage DC power supply 40, the semiconductor wafer W can be attracted to and held on the electrostatic chuck 36 by the electrostatic force.

A coolant cavity or a coolant path 44 of, e.g., a circular ring-shape, may be formed within the susceptor 12. A coolant, such as cooling water cw, having a certain temperature may be supplied into and circulated through the coolant path 44 from a chiller unit (not illustrated) via lines 46 and 48. By adjusting the temperature of the cooling water cw, it may be possible to control a process temperature of the semiconductor wafer W held on the electrostatic chuck 36. Further, a heat transfer gas, such as a He gas, may be supplied from a heat transfer gas supply unit (not illustrated) into a space between an upper surface of the electrostatic chuck 36 and a rear surface of the semiconductor wafer W through a gas supply line 50. Furthermore, an elevating mechanism (not shown) including lift pins configured to move up and down vertically through the susceptor 12 may be provided to load and unload the semiconductor wafer W.

Hereinafter, there will be explained a configuration of each component which is related to plasma generation in this inductively coupled plasma etching apparatus.

A ceiling or a ceiling plate of the chamber 10 may be separated relatively far from the susceptor 12. A circular dielectric window 52 formed of, for example, a quartz plate may be airtightly provided as the ceiling plate. Above the dielectric window 52, an antenna chamber 56 may be provided as a part of the chamber 10. The antenna chamber 56 may accommodate therein a RF antenna 54 and shield this RF antenna 54 from the outside. Here, the RF antenna 54 may generate inductively coupled plasma within the chamber 10.

The RF antenna 54 is provided in parallel to the dielectric window 52. Desirably, the RF antenna 54 may be placed on the top surface of the dielectric window 52 and include an inner coil 58, an intermediate coil 60, and an outer coil 62 with a certain gap therebetween in a radial direction. The coils 58, 60, 62 are coaxially (preferably, concentrically) arranged. Further, the coils 58, 60, 62 are also arranged concentrically with each other as well as with the chamber 10 or the susceptor 12.

In the illustrative embodiment, the term "coaxial" means that central axes of multiple objects having axisymmetric shape are aligned with each other. As for multiple coils, respective coils surfaces may be offset with each other in an axial direction or may be aligned on the same plane (positioned concentrically).

Further, the inner coil 58, the intermediate coil 60 and the outer coil 62 are electrically connected in parallel between a high frequency power supply line 68 from a high frequency power supply unit 66 for plasma generation and a return line 70 toward a ground potential member (i.e., between two nodes $N_A$ and $N_B$). Here, the return line 70 as an earth line is grounded and is connected with a ground potential member (for example, the chamber 10 or other member) that is electrically maintained at a ground potential.

A variable capacitor 86 is provided between the node $N_B$ on the earth line 70 and the intermediate coil 60. Further, a variable capacitor 88 is provided between the node $N_B$ on the earth line 70 and the outer coil 62. Capacitances of these variable capacitors 86 and 88 may be independently adjusted to a desired value within a certain range by a capacitance varying unit 90 under the control of a main controller 84. Hereinafter, a capacitor connected in series to the inner coil 58 will be referred to as an "inner capacitor"; a capacitor connected in series to the intermediate coil 60 will be referred to as an "intermediate coil"; and a capacitor connected in series to the outer coil 62 will be referred to as an "outer capacitor." All these capacitors are provided between the node $N_A$ and $N_B$.

The high frequency power supply unit 66 may include a high frequency power supply 72 and a matching unit 74. The high frequency power supply 72 is capable of outputting a variable high frequency power $RF_H$ having a frequency (typically, equal to or higher than about 13.56 MHz) for generating plasma by an inductively coupled high frequency electric discharge. The matching unit 74 has a reactance-variable matching circuit for performing matching between an impedance of the high frequency power supply 72 and an impedance of load (mainly, RF antenna or plasma).

A processing gas supply unit for supplying a processing gas into the chamber 10 may include an annular manifold or buffer unit 76; multiple sidewall gas discharge holes 78; and a gas supply line 82. The buffer unit 76 may be provided at an inside (or outside) of the sidewall of the chamber 10 to be located at a position slightly lower than the dielectric window 52. The sidewall gas discharge holes 78 may be formed along a circumference at a regular interval and opened to the plasma generation space from the buffer unit 76. The gas supply line 82 may be extended from a processing gas supply source 80 to the buffer unit 76. The processing gas supply source 80 may include a flow rate controller and an opening/closing valve (not shown).

The main controller 84 may include, for example, a micro computer and may control an operation of each component within this plasma etching apparatus, for example, the exhaust unit 26, the high frequency power supplies 30 and 72, the matching units 32 and 74, the switch 42 for the electrostatic chuck, the variable capacitors 86 and 88, the processing gas supply source 80, the chiller unit (not shown), and the heat transfer gas supply unit (not shown) as well as a whole operation (sequence) of the apparatus.

In order to perform an etching process in this inductively coupled plasma etching apparatus, when the gate valve 28 becomes open, the semiconductor wafer W as a process target may be loaded into the chamber 10 and mounted on the electrostatic chuck 36. Then, after closing the gate valve 28, an etching gas (generally, an mixture gas) may be introduced into the chamber 10 from the processing gas supply source 80 via the gas supply line 82, the buffer unit 76, and the sidewall gas discharge holes 78 at a certain flow rate and a flow rate ratio. Subsequently, an internal pressure of the chamber 10 may be controlled to be a certain level by the exhaust unit 26. Further, the high frequency power supply 72 of the high frequency power supply unit 66 is turned on, and the high frequency power $RF_H$ for plasma generation is outputted at a certain RF power level. A current of the high frequency power $RF_H$ is supplied to the inner coil 58, the intermediate coil 60 and the outer coil 62 of the RF antenna 54 through the matching unit 74, the RF power supply line 68 and the return line 70. Meanwhile, the high frequency power supply 30 may be turned on to output the high frequency power $RF_L$ for ion attraction control at a certain RF power level. This high frequency power $RF_L$ may be applied to the susceptor 12 via the matching unit 32 and the power supply rod 34. Further, a heat transfer gas (a He gas) may be supplied to a contact interface between the electrostatic chuck 36 and the semiconductor wafer W from the heat transfer gas supply unit. Furthermore, the switch 42 is turned on, and then, the heat transfer gas may be confined in the contact interface by the electrostatic force of the electrostatic chuck 36.

Within the chamber 10, an etching gas discharged from sidewall gas discharge holes 78 is diffused into a processing space below the dielectric window 52. By the current of the high frequency power $RF_H$ flowing in the coils 58, 60 and 62, magnetic force lines (magnetic flux) generated around these coils are transmitted to the processing space (plasma generation space) within the chamber 10 via the dielectric window 52. An induced electric field may be generated in an azimuth direction within the processing space. Then, electrons accelerated by this induced electric field in the azimuth direction may collide with molecules or atoms of the etching gas so as to be ionized. In the process, donut-shaped plasma may be generated.

Radicals or ions in the donut-shaped plasma may be diffused in all directions within the large processing space. To be specific, while the radicals are isotropically introduced and the ions are attracted by a DC bias, the radicals and the ions may be supplied on an upper surface (target surface) of the semiconductor wafer W. Accordingly, plasma active species may perform chemical and physical reactions on the target surface of the semiconductor wafer W so as to etch a target film into a required pattern.

Herein, "donut-shaped plasma" is not limited to only ring-shaped plasma which is generated only at the radial outside in the chamber 10 without being generated at the radial inside (at a central area) therein. Further, "donut-shaped plasma" may include a state where a volume or a density of the plasma generated at the radial outside is greater than that at the radial inside. Further, depending on a kind of a gas used for the processing gas, an internal pressure of the chamber 10, or the like, the plasma may have other shapes instead of "a donut shape".

In the inductively coupled plasma etching apparatus, the RF antenna 54 is segmented into the inner coil 58, the intermediate coil 60, and the outer coil 62, which have different coil diameters. As a result, a wavelength effect or an electric potential difference (voltage drop) in the RF antenna 54 is effectively suppressed or reduced. Further, except for the inner coil 58, the variable capacitors 86, 88 are connected in series to the intermediate coil 60 and the outer coil 62, respectively. Therefore, plasma density distribution on the semiconductor wafer W can be simply and effectively controlled.

[Basic Configuration and Operation of the RF Antenna]

Figure 2:
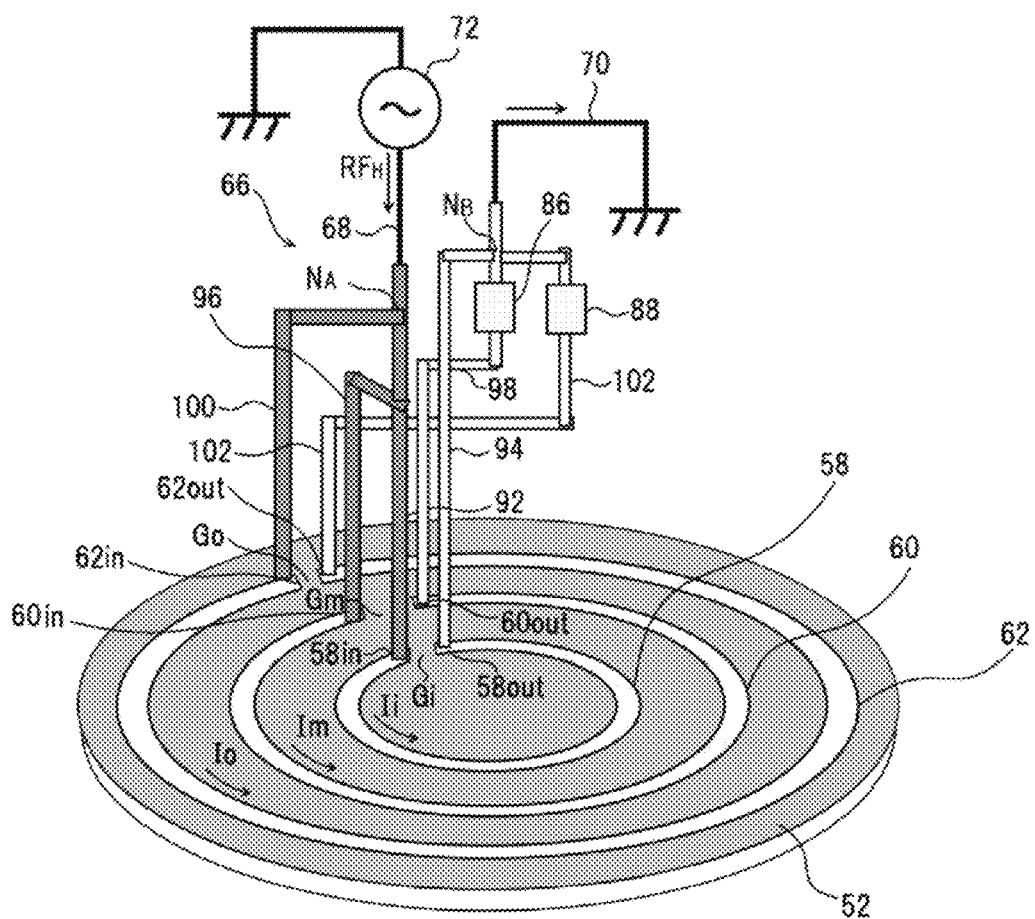
FIG. 2 is a perspective view showing a basic configuration of a layout and an electric connection of a variable capacitor provided within RF antenna in accordance with the illustrative embodiment.
Figure 3:
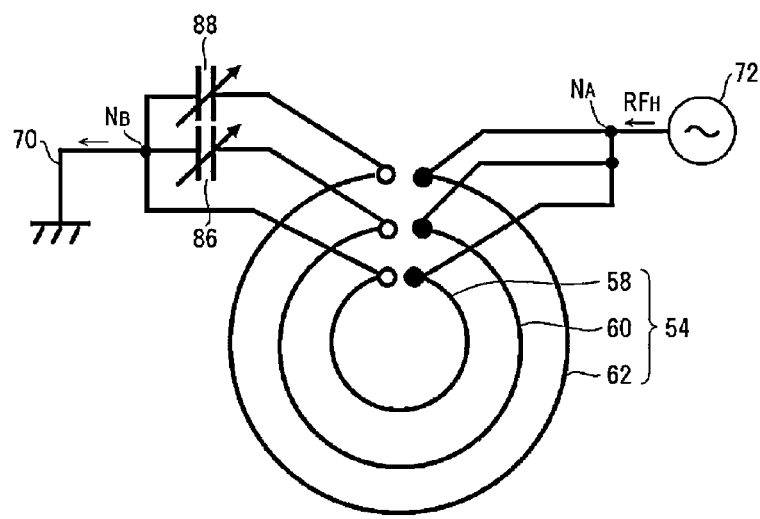
FIG. 3 is a diagram illustrating operation of an experimental example of FIG. 2.
Figure 3:
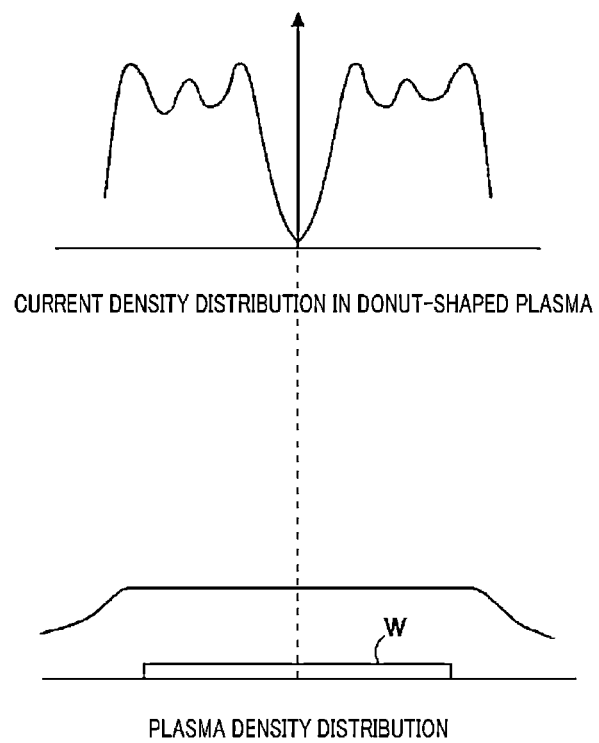

FIGS. 2 and 3 illustrate a basic configuration of a layout and an electric connection (circuit) of the RF antenna 54 in accordance with the illustrative embodiment.

As illustrated in FIG. 2, the inner coil 58 includes a single circular-ring shaped coil with a gap or a space $G_i$ therein, and the inner coil 58 has a constant radius. Further, the inner coil 58 is positioned near a central portion of the processing chamber 10 in the diametrical direction. One end of the inner coil 58, i.e., an RF input terminal 58in is connected to the RF power supply line 68 of the high frequency power supply unit 66 via the first node $N_A$ and the connection conductor 92 extending upwardly. The other end of the inner coil 58, i.e., an RF output terminal 58out is connected to the earth line 70 via the second node $N_B$ and the connection conductor 94 extending upwardly.

The intermediate coil 60 includes a single circular-ring shaped coil with a gap or a space $G_m$ therein, and the intermediate coil 60 has a constant radius. Further, the intermediate coil 60 is positioned at a portion of more outer than the inner coil 58 in the diametrical direction in a middle portion of the processing chamber 10. One end of the intermediate coil 60, i.e., an RF input terminal 60in is adjacent to the RF input terminal 58in of the inner coil 58 in the diametrical direction. Further, the RF input terminal 60in is connected to the RF power supply line 68 of the high frequency power supply unit 66 via the first node $N_A$ and the connection conductor 96 extending upwardly. The other end of the intermediate coil 60, i.e., an RF output terminal 60out is adjacent to the RF output terminal 58out of the inner coil 58 in the diametrical direction. Further, the RF output terminal 60out is connected to the earth line 70 via the second node $N_B$ and the connection conductor 98 extending upwardly.

The outer coil 62 includes a single circular-ring shaped coil with a gap or a space $G_o$ therein, and the outer coil 62 has a constant radius. The outer coil 62 is positioned at a portion of more outer than the intermediate coil 60 in the diametrical direction near the side wall of the processing chamber 10. One end of the outer coil 62, i.e., an RF input terminal 62in is adjacent to the RF input terminal 60in of the intermediate coil 60 in the diametrical direction. The RF input terminal 62in is connected to the RF power supply line 68 of the high frequency power supply unit 66 via the first node $N_A$ and the connection conductor 100 extending upwardly. The other end of the outer coil 62, i.e., an RF output terminal 62out is adjacent to the RF output terminal 60out of the intermediate coil 60 in the diametrical direction. The RF output terminal 62out is connected to the earth line 70 via the second node $N_B$ and the connection conductor 102 extending upwardly.

As illustrated in FIG. 2, the connection conductors 92 to 102 upwardly extending from the RF antenna 54 serve as branch lines or connecting lines in horizontal directions while spaced apart from the dielectric window 52 at a sufficiently large distance (i.e., at considerably high positions). Accordingly, electromagnetic influence upon the coils 58, 60 and 62 can be reduced.

In the above-described coil arrangement and segment connection configuration within the RF antenna 54, when connecting from the high frequency power supply 72 to the ground potential member via the RF power supply line 68, the RF antenna 54, and the earth line 70, more directly, when connecting from the first node $N_A$ to the second node $N_B$ via high frequency branch transmission lines of the coils 58, 60, 62 within the RF antenna 54, the directions when passing through the inner coil 58, the intermediate coil 60, and the outer coil 62 are all counterclockwise of FIG. 2 and identical to the circumferential direction.

In the inductively coupled plasma etching apparatus in accordance with the illustrative embodiment, a high frequency current supplied from the high frequency power supply unit 66 flows through each of component within the RF antenna 54. As a result, high frequency AC magnetic fields distributed in loop shapes are formed around the inner coil 58, the intermediate coil 60 and the outer coil 62 of the RF antenna 54 according to the Ampere's Law. Further, under the dielectric window 52, magnetic force lines passing through the processing space in the radial direction are formed even in a relatively lower region.

In this case, a diametric directional (horizontal) component of a magnetic flux density in the processing space may be zero (0) constantly at a central region and a periphery of the processing chamber 10 regardless of a magnitude of the high frequency current. Further, the radial directional (horizontal) component of a magnetic flux density in the processing space may have a maximum value at a certain portion therebetween. A density distribution of the induced electric field in the azimuth direction generated by the AC magnetic field of the high frequency may have the same pattern as a magnetic flux density distribution in a diametrical direction. That is, an electron density distribution within the donut-shaped plasma in the diametrical direction may substantially correspond to a current split within the RF antenna 54 in a macro view.

The RF antenna 54 of the illustrative embodiment is different from a typical spiral coil wound from its center or inner peripheral end to an outer peripheral end thereof. That is, the RF antenna 54 includes the circular ring-shaped inner coil 58 localized to the central portion of the antenna; the circular ring-shaped intermediate coil 60 localized to the intermediate portion of the antenna; and the circular ring-shaped outer coil 62 localized to a peripheral portion of the antenna. A current split in the RF antenna 54 may be concentrated in the vicinities of each of the coils 58, 60 and 62.

Here, a high frequency current $I_i$ (hereinafter, referred to as an "inner coil current") may be regular or uniform over the loop of the inner coil 58 and flows in the inner coil 58. A high frequency current $I_m$ (hereinafter, referred to as an "intermediate coil current") may be regular or uniform over the loop of the intermediate coil 60 and flows in the intermediate coil 60. A high frequency current $I_o$ (hereinafter, referred to as an "outer coil current") may be regular or uniform over the loop of the outer coil 62 and flows in the outer coil 62.

Therefore, in the donut-shaped plasma generated below (inside) the dielectric window 52 of the processing chamber 10, as shown in FIG. 3), a current density (i.e. plasma density) may be remarkably increased (maximized) at positions right below the inner coil 58, the intermediate coil 60 and the outer coil 62. Thus, a current density distribution within the donut-shaped plasma may not be uniform in a diametrical direction and may have an uneven profile. However, since the plasma is diffused in all directions within the processing space of the processing chamber 10, a plasma density in a vicinity of the susceptor 12, i.e. on the substrate W, may become very uniform.

In the present illustrative embodiment, the inner coil 58, the intermediate coil 60 and the outer coil 62 have the circular ring shapes. Further, since a regular or uniform high frequency currents flow in the circumferential directions of the coils, a plasma density distribution can constantly be uniformized in the circumferential directions of the coils in the vicinity of the susceptor 12, i.e., on the substrate W as well as within the donut-shaped plasma.

Further, in the radial direction, by varying and setting the electrostatic capacitances $C_{86}$ and $C_{88}$ of the intermediate capacitor 86 and the outer capacitor 88 to have appropriate values within certain ranges, it is possible to adjust a balance between the currents $I_i$, $I_m$ and $I_o$ flowing in the inner coil 58, the intermediate coil 60 and the outer coil 62, respectively. Accordingly, plasma density distribution within the donut-shaped plasma can be controlled as desired. Thus, plasma density distribution in the vicinity of the susceptor 12, i.e., on the substrate W can be controlled as desired, and plasma density distribution can be easily uniformized with high accuracy.

In the illustrative embodiment, the wavelength effect and the voltage drop within the RF antenna 54 depend on a length of each of the coils 58, 60, 62. Accordingly, by setting the length of each of the coils to prevent the wavelength effect from occurring in the coils 58, 60, 62, both the wavelength effect and the voltage drop within the RF antenna 54 can be reduced. In order to prevent the wavelength effect, the length of each of the coils 58, 60, 62 is desirably shorter than a ¼ wavelength of the high frequency $RF_H$.

The condition that the length of each the coil is less than a ¼ wavelength of the high frequency $RF_H$ is easily satisfied when a diameter of a coil is small, and the number of windings is small. Accordingly, in the RF antenna, the inner coil 58 having a smallest diameter can be easily subject to a configuration of a multiple number of windings. The outer coil 62 having a largest diameter is desirably subject to a single winding, rather than a multiple number of windings. The intermediate coil 60 depends on a diameter of the semiconductor wafer W, the frequency of the high frequency $RF_H$, and the like. However, the intermediate coil 60 is desirably subject to a single winding, like the outer coil 62.

[Functions of Capacitors Added to the RF Antenna]

The core technical feature of the illustrative embodiment lies in that the RF antenna 54 is segmented in parallel in the diametrical direction into the three coils 58, 60, 62 having different coil diameters. Further, the variable intermediate capacitor 86 and the variable outer capacitor 88 are electrically connected in series to the intermediate coil 60 and the outer coil 62, respectively. Meanwhile, any reactance device (in particular, a capacitor) is not connected to the inner coil 58.

Figure 4:
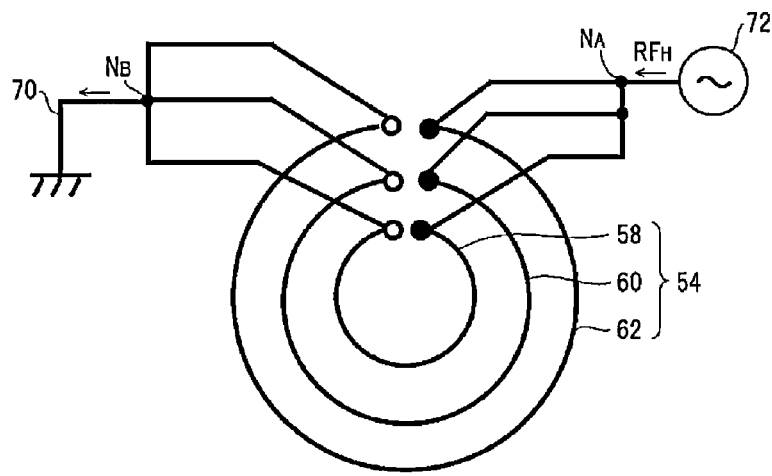
FIG. 4 is a diagram showing electrical connection and an operation of the electrical connection when capacitors are omitted in the RF antenna of FIG. 2.
Figure 4:
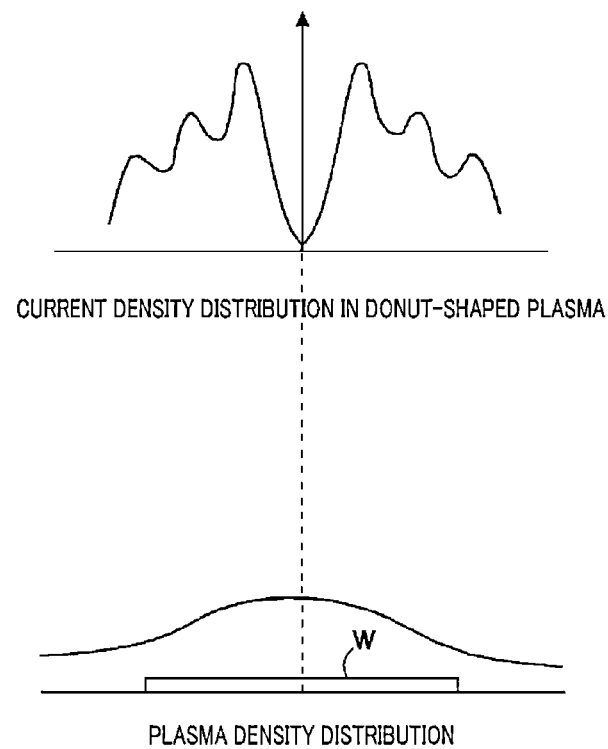

Here, as illustrated in FIG. 4, it is assumed that no capacitor is connected to the RF antenna. In such case, more remarkable and stronger plasma than that generated directly under the intermediate coil 60 and the outer coil 62 is generated directly under the inner coil 58. The reason that the remarkable and strong plasma is generated directly under the inner coil 58 will be described. A self-inductance L of a single circular ring-shaped coil is expressed by the formula (1) below, where a thickness (radius) of a coil conducting wire is represented as "a", and a coil diameter (radius) is represented as "r".

[Formula (1)]

$$L = r\mu_0 \left( \log \frac{8r}{a} - 2 \right) \quad (1)$$

Here, $\mu_o$ is a vacuum permeability, and the coil diameter (radius) r is a middle value between a radius of an inner periphery of a coil and a radius of an outer periphery of a coil.

From the formula (1), the self-inductance L is linearly proportional to the coil radius r. When a frequency of the high frequency is f, an impedance Z of the circular ring-shaped coil is $2\pi fL$ ($Z=2\pi fL$), and proportional to the self-inductance L. Accordingly, if the coil radiuses of the inner coil 58, the intermediate coil 60, and the outer coil 62 are, for example, about 50 mm, about 100 mm, and about 150 mm, respectively, the inner coil current $I_i$ flows in the inner coil 58, and an amount of the inner coil current $I_i$ is approximately 2 times larger than the intermediate coil current $I_m$ flowing in the intermediate coil 60, and approximately 3 times larger than the outer coil current $I_o$ flowing in the outer coil 62. Density of the plasma generated by the circular ring-shaped coils is slightly lowered in efficiency when the radiuses of the coils are small. However, the plasma density generally depends on an amount of the coil currents, regardless of the radiuses of the coils. As such, several times stronger plasma than that generated directly under the intermediate coil 60 and the outer coil 62 is generated directly under the inner coil 58. Accordingly, the plasma density distribution near the susceptor 12, i.e., on the semiconductor wafer W has a profile, where the central portion in the diametrical direction is protruded and becomes high.

However, a coil has a positive reactance, and a capacitor has a negative reactance. When a capacitor is connected to a coil, the negative reactance of the capacitor removes the positive reactance of the coil. As a result, a combined reactance becomes lower than the reactance of the coil. Accordingly, increasing the amount of the inner coil current $I_i$ by connecting a capacitor to the inner coil 58 does not have an effect on the uniformity of the plasma density distribution, and rather, results in a reverse effect thereon.

This is the same when the coils 58, 60, 62 are configured by spiral coils having $N_i$, $N_m$, and $N_o$ turns, respectively. That is, since an inductance of each coil is proportional to the number of turns (the number of windings), an impedance of each coil is also proportional to the number of turns. Accordingly, a ratio of the coil currents ($I_i$, $I_o$) flowing in the inner coil 58 and the outer coil 62, respectively, is $I_i:I_o=r_o*N_o*N_i:r_i*N_i*N_o=r_o:r_i$. Meanwhile, the plasma density ($n_i$, $n_o$) generated directly under each of the coils 58 and 62 is determined by multiplying the coil current and the number of turns. Accordingly, a ratio of the plasma densities ($n_i$, $n_o$) generated directly under the inner coil 58 and the outer coil 62 is $n_i:n_o=r_o*N_o*N_i:r_i*N_i*N_o=r_o:r_i$, which depends on a ratio of radiuses. The ratio of the coil currents and the plasma densities is identically applied to the case of the inner coil 58 and the intermediate coil 60. As described, constantly, stronger plasma than those generated directly under the intermediate coil 60 and the outer coil 62 is generated directly under the inner coil 58.

Actually, an impedance of a wiring from the output terminal of the matching unit 74 to the corresponding coil cannot be ignored. A length of the wiring is determined by a height from the output terminal of the matching unit 74 to the RF antenna 54. Thus, it may be assumed that the length of the wiring is the same among the inner side, the intermediate side, and the outer side. Further, it is assumed that the wiring impedance is the same at the inner side, the intermediate side, and the outer side. In such case, if the outer coil 62 and the inner coil 58 have impedances of about 75Ω and about 25Ω, respectively, when the wiring impedance is approximately about 10Ω, $I_i:I_o=(75+10):(25+10)=85:35=2.41:1$. Thus, there is still a difference two or more times between the impedances of the coils and the wiring impedance.

When a pressure is relatively high (generally, more than about 100 mTorr), and thus, plasma is difficult to be diffused, the above-described balance is achieved at the inner side and the outer side. However, when a pressure is lowered, and thus, the plasma is easy to be diffused, a plasma density at a central portion is further protruded and becomes high.

Accordingly, there is established a theory providing that under any conditions, a plasma density directly under an innermost coil, among a multiple number of coils electrically connected in parallel to one another and having different diameters, becomes relatively high.

In the illustrative embodiment, based on the above-described theory, no capacitor is added (connected) to the inner coil 58 between the both terminals (between the first node $N_A$ and the second node $N_B$) of the RF antenna 54. The variable capacitors 86, 88 are connected in series to the intermediate coil 60 and the outer coil 62, respectively. By adjusting the electrostatic capacitances $C_{86}$, $C_{88}$ of the variable capacitors 86, 88 in consideration of reducing a combined reactance, the amounts of the coil currents $I_m$, $I_o$ flowing in the intermediate coil 60 and the outer coil 62, respectively, are properly increased. In this manner, it is possible to conform the coil currents $I_i$, $I_m$, $I_o$ to be in substantially the same amounts. Alternatively, it is possible to make the intermediate coil current $I_m$ and/or the outer coil current $I_o$ larger than the inner coil current $I_i$. Here, the increasing amounts of the coil currents $I_m$, $I_o$ by the variable capacitors 86, 88 flow in the intermediate coil 60 and the outer coil 62, and contribute to the plasma generation. Thus, no waste of high frequency power is generated.

In general, in order to correct the profile, where a plasma density is protruded and becomes high at the central portion of the diametrical direction, it is effective to adjust a ratio (balance) of the inner coil current $I_i$ flowing in the inner coil 58 and the outer coil current $I_o$, flowing in the outer coil 62. In the illustrative embodiment, a ratio of the coil currents $I_i$, $I_o$ can be adjusted simply by varying the electrostatic capacitance $C_{88}$ of the outer capacitor 88.

In this case, in order to uniformize the plasma density distribution under various conditions, it is desirable to set a variable range of multiplication ($I_o*n_o$) of the outer coil current $I_o$ and the number of turns $n_o$ of the outer coil 62 to have a lower limit value smaller than and an upper limit value larger than multiplication ($I_i*n_i$) of the inner coil current $I_i$ and the number of turns $n_i$ of the inner coil 58. The ratio of the inner coil current $I_i$ and the outer coil current $I_o$ is proportional to a ratio of reciprocal numbers of an impedance of the inner coil 58 (hereinafter, referred to as an "inner impedance") and a combined impedance of the outer coil 62 and the outer capacitor 88 (hereinafter, referred to as an "outer combined impedance"). Accordingly, if the inner impedance (fixed value) is represented as $Z_i$, and minimum and maximum values for the outer combined impedance (variable value) are represented as $Z_o(min)$ and $Z_o(max)$, respectively, the above-described condition for a multiplication of the coil current and the number of turns is expressed as follows:

[Formula (2)]

$$|N_o/Z_{o(max)}| < |N_i/Z_i| < |N_o/Z_{o(min)}| \qquad (2)$$

Further, the inner impedance $Z_i$ and the outer combined impedance $Z_o$ depend on their respective average coil radiuses, except for the electric connecting portion. An effect of the electric connecting portion cannot be ignored, but is not dominant. Thus, the above-described condition may be expressed as follows:

[Formula (3)]

$$\frac{1}{2\pi f r_o \mu_0 \left(\log\frac{8r_o}{a}-2\right) - \frac{1}{2\pi f N_o C_{o(max)}}} <$$

$$\frac{1}{2\pi f r_i \mu_0 \left(\log\frac{8r_i}{a}-2\right)} < \frac{1}{2\pi f r_o \mu_0 \left(\log\frac{8r_o}{a}-2\right) - \frac{1}{2\pi f N_o C_{o(min)}}} \qquad (3)$$

Here, $C_o(min)$ is a value of the electrostatic capacitance $C_{88}$ of the outer capacitor 88 when the outer combined impedance $Z_o$ is minimum within an adjustable range. $C_o(max)$ is a value of the electrostatic capacitance $C_{88}$ of the outer capacitor 88 when the outer combined impedance $Z_o$ is maximum. $C_o(min)$ and $C_o(max)$ may not be the same as the minimum value and the maximum value of the variable range. The outer combined impedance $Z_o$ becomes minimum, when the outer coil 62 and the outer capacitor 88 cause a series resonance. $C_o(min)$ is a value of the electrostatic capacitance $C_{88}$ of the outer capacitor 88 at that time. The outer combined impedance $Z_o$ becomes maximum, when the electrostatic capacitance $C_{88}$ of the outer capacitor 88 becomes apart from the series resonance point up to an upper or lower limit of the variable range. $C_o(max)$ is a value of the electrostatic capacitance $C_{88}$ of the outer capacitor 88 at that time.

As described, no capacitor is connected to the inner coil 58, and the outer capacitor 88 is connected in series to the outer coil 62. By varying the electrostatic capacitance $C_{88}$ of the outer capacitor 88, the ratio of the inner coil current $I_i$ and the outer coil current $I_o$ is properly adjusted. Also, a general profile of the plasma density distribution within the donut-shaped plasma generated directly under the RF antenna 54 (in particular, balance between the central portion and the peripheral portion) can be properly controlled.

In the illustrative embodiment, the intermediate coil 60 is arranged between the inner coil 58 and the outer coil 62. The variable intermediate capacitor 86 is connected in series to the intermediate coil 60. This configuration is intended to minutely control the plasma density distribution (in particular, at the intermediate portion) within the donut-shaped plasma. The configuration is useful when generating plasma under a low pressure or generating plasma of a large diameter.

Instead of providing the intermediate coil 60, it is considered to form the outer coil 62 in a spiral shape to cover the area of the intermediate portion of the antenna 54 with the outer coil 62. In this case, however, the same coil current $I_o$ flows in all sections of the outer coil 62. Thus, the plasma density directly under the intermediate portion of the antenna may become relatively high. It becomes difficult to achieve a uniform profile, for example, in the diametrical direction.

In actual processes, there is a case where a desirable profile (e.g., flat) in the whole diametrical direction is obtained by forcibly reducing the plasma density within the donut-shaped plasma directly under the intermediate portion of the antenna. In particular, this situation easily occurs when an amount of the outer coil current $I_o$ is rapidly increased in order to raise peripheral plasma density to a desired level.

In this case, the intermediate capacitor 86 is used effectively. That is, the electrostatic capacitance $C_{86}$ of the intermediate capacitor 86 is varied in a range lower than a value of a series resonance point. As a result, a combined reactance of the intermediate coil 60 and the intermediate capacitor 86 (hereinafter, referred to as an "intermediate combined reactance") becomes a negative value. Accordingly, the intermediate coil current $I_m$ flows in a direction opposite to the circumferential direction and in a certain current amount (in particular, it is also possible to slightly increase the current amount from the state of substantially zero (0)). Accordingly, the plasma density within the donut-shaped plasma directly under the intermediate coil can be locally and easily controlled. Furthermore, the plasma density distribution in the whole diametrical direction near the susceptor 12, i.e., on the semiconductor wafer W can be easily controlled.

Figure 5A:
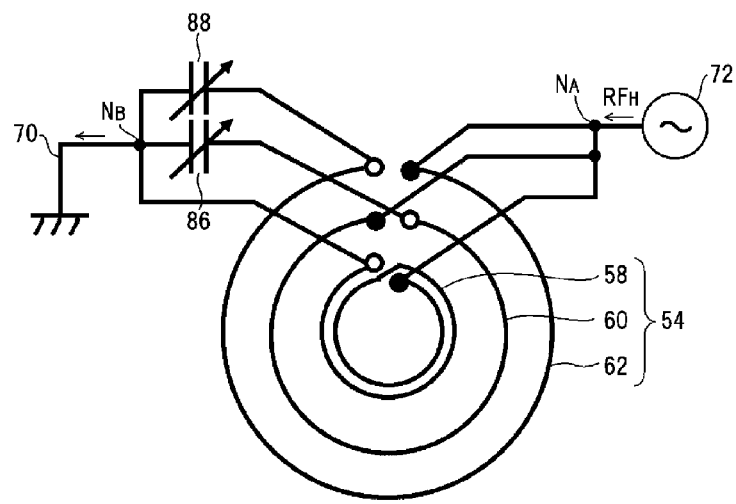
FIG. 5A is a diagram showing a basic configuration of a layout and an electric connection of a variable capacitor added in RF antenna for an experiment in accordance with the illustrative embodiment.
Figure 5B:
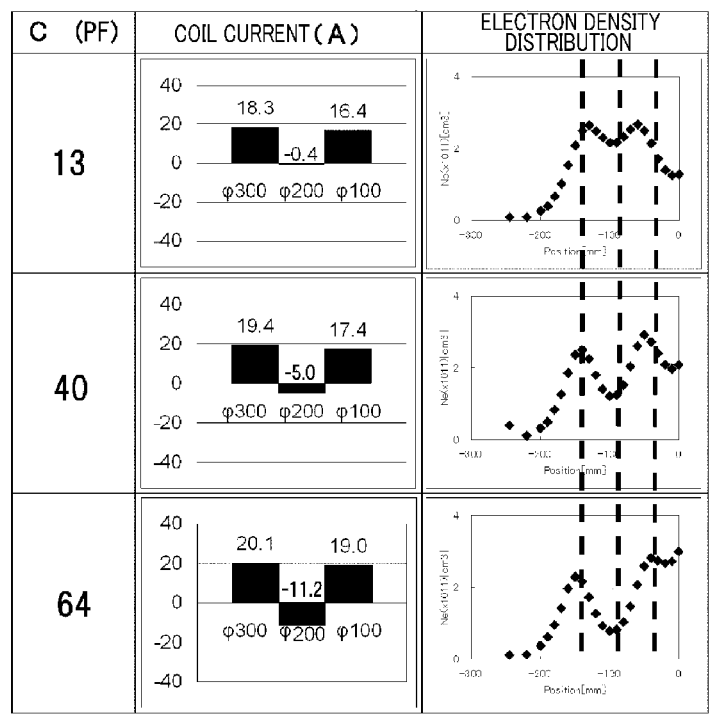
FIG. 5B is a diagram showing coil current distribution and electron density distribution measured by varying electrostatic capacitance of an intermediate capacitor in the above-described experiment.

The function of the intermediate capacitor 86 has been verified by the experiment shown in FIGS. 5A and 5B. In the experiment, as illustrated in FIG. 5A, the inner coil 58 of the RF antenna 54 is formed with two windings (2 turns) having a diameter of about 100 mm. The intermediate coil 60 and the outer coil 62 are formed with a single winding (single turn) having diameters of about 200 mm and about 300 mm, respectively. As primary process conditions, the frequency of the high frequency $RF_H$ is about 13.56 MHz, the RF power is about 1500 W, a pressure in the processing chamber 10 is about 100 mTorr, the processing gas is a mixture gas of Ar and $O_2$, and a flow rate of the processing gas is $Ar/O_2$=about 300/30 sccm.

In the experiment, the electrostatic capacitance $C_{88}$ of the outer capacitor 88 is fixed at about 560 pF. The electrostatic capacitance $C_{86}$ of the intermediate capacitor 86 is varied to about 13 pF, to about 40 pF, and to about 64 pF. In this case, it is confirmed that as shown in FIG. 5B, the intermediate coil current $I_m$ is changed to about −0.4 A, to about −5.0 A, and to about −11.2 A, and the electron density $N_e$ (i.e., plasma density) near a portion directly under the intermediate coil 60 can be locally and properly lowered. When $C_{86}$ is about 13 pF, the inner and outer coil currents $I_i$, $I_o$ are about 16.4 A and about 18.3 A, respectively. When $C_{86}$ is about 40 pF, the inner and outer coil currents $I_i$, $I_o$ are about 17.4 A and about 19.4 A, respectively. When $C_{86}$ is about 64 pF, the inner and outer coil currents $I_i$, $I_o$ are about 19.0 A and about 20.1 A, respectively. If an amount of the intermediate coil current $I_m$ flowing in the opposite direction increases, amounts of the inner coil current $I_i$ and the outer coil current $I_o$, which flow in the forward direction, slightly increase. However, a ratio (balance) of the coil currents $I_i$, $I_o$ usually does not vary.

With respect to other functions in the RF antenna 54 of the present illustrative embodiment, it is possible to vary the electrostatic capacitance $C_{88}$ of the outer capacitor 88 in a range lower than the value of the series resonance point. As a result, a combined reactance of the outer coil 62 and the outer capacitor 88 (hereinafter, referred to as an "outer combined reactance") becomes a negative value. Accordingly, it is possible to make the outer coil current $I_o$ flow in the opposite direction. For example, if plasma diffuses excessively toward the outer side of the diametrical direction within the processing chamber 10, the inner wall of the processing chamber 10 may be easily damaged. In such case, it is possible to make the coil current $I_o$ flow in a direction opposite to the outer coil 62, thereby confining the plasma in the inner side of the outer coil 62. As a result, the damage of the inner wall in the processing chamber 10 can be prevented. This function is effective, for example, when a multiple number of intermediate coils 60 having different coil diameters are arranged while being spaced from one another in the diametrical direction, or when the outer coil 62 is arranged at a further outer side of the diametrical direction than the susceptor 12.

In the illustrative embodiment, by making at least one of the electrostatic capacitances $C_{86}$, $C_{88}$ of the intermediate capacitor 86 and the outer capacitor 88 close to a value when a series resonance is generated, it is possible to reduce the inner coil current $I_i$ flowing in the inner coil 58. By making at least one of the electrostatic capacitances $C_{86}$, $C_{88}$ of the intermediate capacitor 86 and the outer capacitor 88 apart from the value when the series resonance is generated, it is possible to increase the inner coil current $I_i$. That is, the inner coil current $I_i$, the intermediate coil current $I_m$, and the outer coil current $I_o$ are in a ratio of $I_i:I_m:I_o=(1/Z_i):(1/Z_m):(1/Z_o)$. Accordingly, as $C_{86}$ and/or $C_{88}$ are close to the value when the series resonance is generated, $Z_m$ and/or $Z_o$ become smaller values. Here, $I_m$ and/or $I_o$ are relatively increased, and $I_i$ becomes smaller. Meanwhile, as $C_{86}$ and/or $C_{88}$ are apart from the value when the series resonance is generated, $Z_m$ and/or $Z_o$ become large values. Here, $I_m$ and/or $I_o$ are relatively decreased, and $I_i$ becomes larger.

[Another Testing Example or a Modified Example for the RF Antenna]

In the illustrative embodiment, in controlling (in particular, uniformizing) the plasma density distribution, no capacitor is connected to the inner coil 58, considering that an amount of the inner coil current $I_i$ does not need to be varied in order to increase the current amount thereof.

However, there is a case where positively or forcibly controlling an amount of the inner coil current $I_i$ is effective. For example, when a pressure in the processing chamber 10 is low, the plasma tends to be gathered at a central portion of the diametrical direction. As described above, this problem may be resolved by varying the electrostatic capacitance $C_{88}$ of the outer capacitor 88 and adjusting a ratio of the inner coil current $I_i$ and the outer coil current $I_o$. However, the problem may not be completely resolved.

Figure 6A:
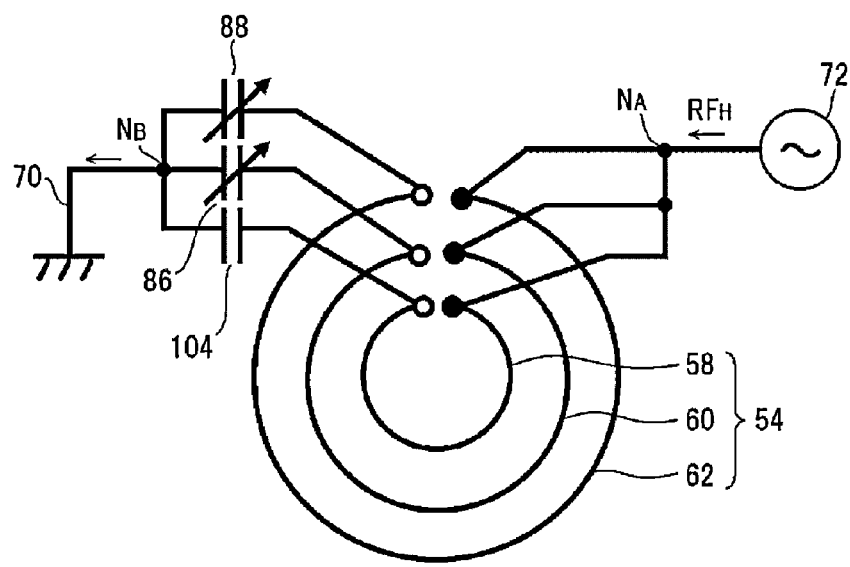
FIG. 6A is a diagram showing a basic configuration of a layout and an electric connection of a variable capacitor added in RF antenna in a modified example of the illustrative embodiment.
Figure 6B:
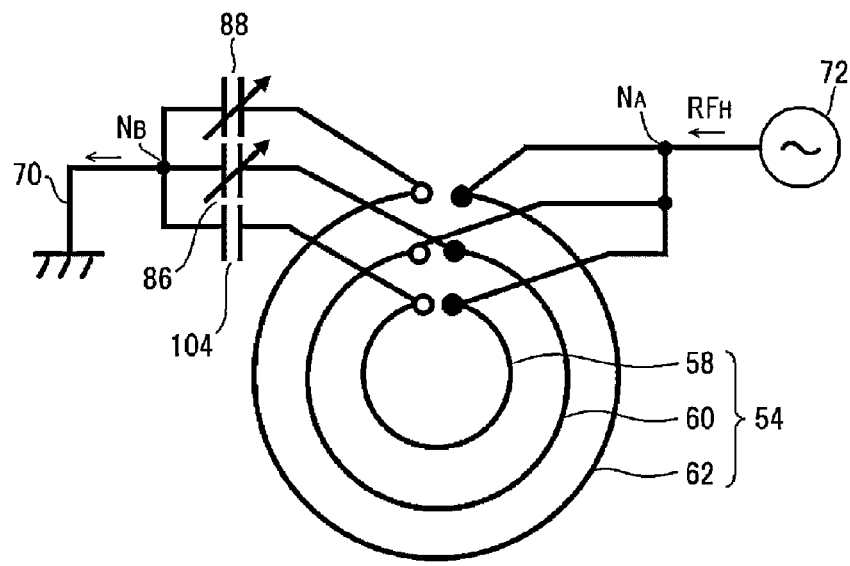
FIG. 6B is an explanatory view illustrating operation of the experimental example of FIG. 6A.

As illustrated in FIGS. 6A and 6B, the fixed or semi-fixed inner capacitor 104 is electrically connected in series to the inner coil 58 between the first node $N_A$ and the second node $N_B$ in the RF antenna 54. In this configuration, it is also possible to select or adjust the electrostatic capacitance $C_{104}$ of the inner capacitor 104 to be a desired value. As a result, a combined reactance $X_i$ of the inner coil 58 and the inner capacitor 104 (hereinafter, referred to as an "inner combined reactance") becomes a desired value. When the fixed or semi-fixed capacitor 104 and the variable outer capacitor 88 are provided, the condition formulas (2) and (3) are also applied with respect to the number of turns of each of the coils or the variable control of the electrostatic capacitance $C_{88}$ of the outer capacitor 88.

Figure 7A:
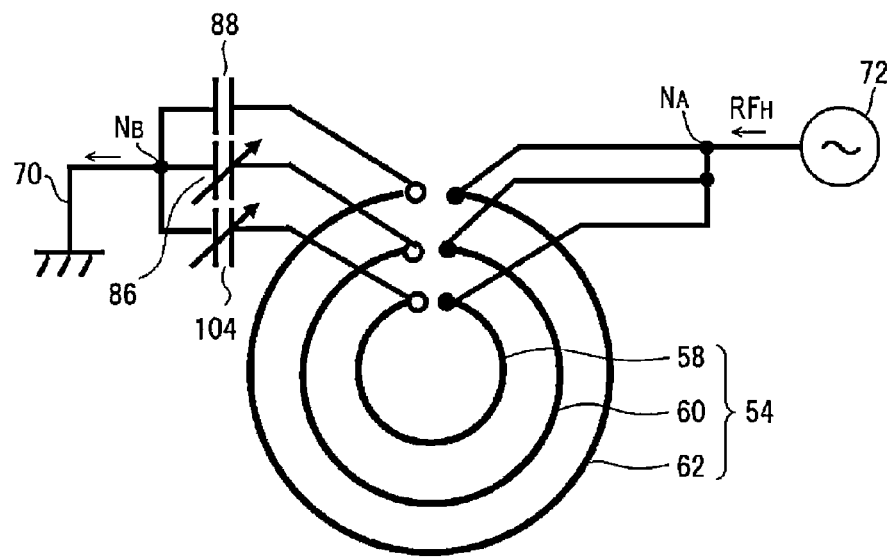
FIG. 7A is a diagram showing a basic configuration of a layout and an electric connection of a variable capacitor added in RF antenna in another experimental example.
Figure 7B:
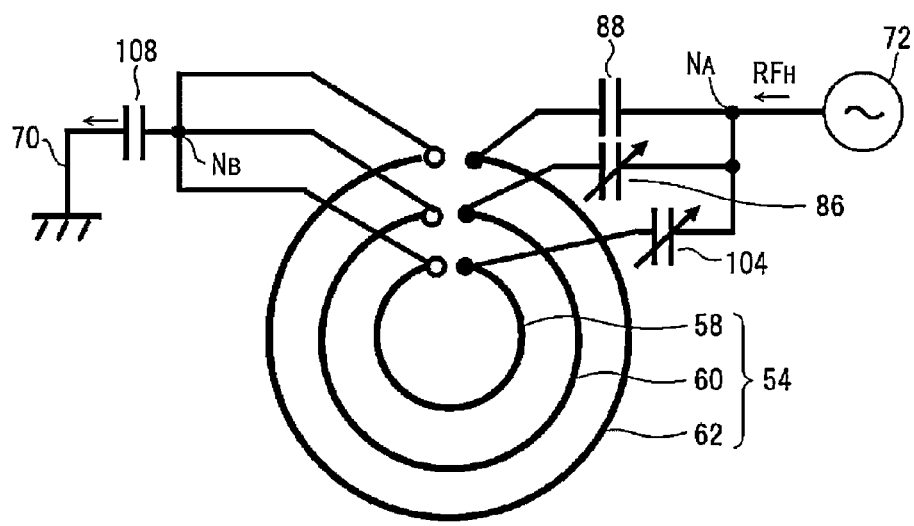
FIG. 7B is a diagram showing a basic configuration of a layout and an electric connection of a variable capacitor added in RF antenna in another experimental example.
Figure 8:
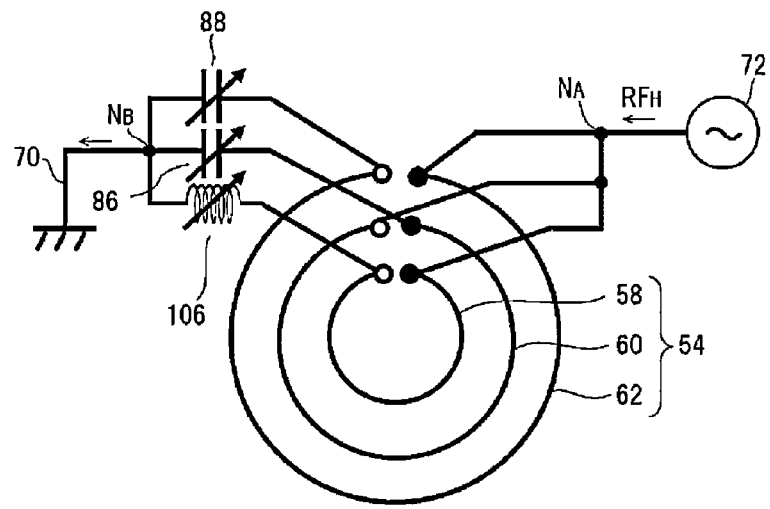
FIG. 8 is a diagram showing a basic configuration of a layout and an electric connection of a variable capacitor added in RF antenna in another experimental example.

Although a freedom degree or an accuracy of the plasma density distribution control is somewhat decreased, in order to reduce costs, a variable capacitor for the inner capacitor 104 and a fixed or semi-fixed capacitor for the outer capacitor 88 may be used, as illustrated in FIGS. 7A and 7B. Although not illustrated herein, a fixed or semi-fixed capacitor for the intermediate capacitor 86 may be used. Further, the intermediate capacitor 86 may be omitted.

When the fixed or semi-fixed outer capacitor 88 and the variable inner capacitor 104 are provided, in uniformizing the plasma density distribution under various conditions, it is desirable to set a variable range of multiplication ($I_i*n_i$) of the inner coil current $I_i$ and the number of turns $n_i$ of the inner coil 58 to have a lower limit value smaller and an upper limit value larger than multiplication ($I_o*n_o$) of the outer coil current $I_o$ and the number of turns ($n_o$) of the outer coil 62. The ratio of the inner coil current $I_i$ and the outer coil current $I_o$ is proportional to a ratio of reciprocal numbers of the combined impedance (inner combined impedance) of the inner coil 58 and the inner capacitor 104, and the combined impedance (outer combined impedance) of the outer coil 62 and the outer capacitor 88. Accordingly, if the outer impedance (fixed value) is represented as $Z_o$, and minimum and maximum values of the inner combined impedance (variable value) are represented as $Z_i(min)$ and $Z_i(max)$, respectively, the above-described condition for the multiplication of the coil current and the number of turns is expressed as follows:

[Formula (4)]

$$|N_i/Z_{i(max)}| < |N_o/Z_o| < |N_i/Z_{i(min)}| \tag{4}$$

The inner combined impedance $Z_i$ and the outer combined impedance $Z_o$ depend on their respective average coil radiuses, except for the electric connecting portion. An effect of the electric connecting portion cannot be ignored, but is not dominant. Thus, the above-described condition may be expressed as follows:

[Formula (5)]

$$\cfrac{1}{2\pi f r_i \mu_0 \left(\log\cfrac{8r_i}{a} - 2\right) - \cfrac{1}{2\pi f N_i C_{i(max)}}} < $$

$$\cfrac{1}{2\pi f r_0 \mu_0 \left(\log\cfrac{8r_0}{a} - 2\right)} < \cfrac{1}{2\pi f r_i \mu_0 \left(\log\cfrac{8r_i}{a} - 2\right) - \cfrac{1}{2\pi f N_i C_{i(min)}}} \tag{5}$$

Here, $C_i(min)$ is a value of the electrostatic capacitance $C_{104}$ of the inner capacitor 104 when the inner combined impedance $Z_i$ is minimum within an adjustable range. $C_i(max)$ is a value of the electrostatic capacitance $C_{104}$ of the inner capacitor 104 when the inner combined impedance $Z_i$ is maximum. $C_i(min)$ and $C_i(max)$ may not be the same as a minimum value and a maximum value of the variable range of $C_{104}$. The inner combined impedance $Z_i$ becomes minimum, when the inner coil 58 and the inner capacitor 104 cause a series resonance. $C_i(min)$ is a value of the electrostatic capacitance $C_{104}$ of the inner capacitor 104 at that time. Further, the inner combined impedance $Z_i$ becomes maximum, when the electrostatic capacitance $C_{104}$ of the inner capacitor 104 becomes apart from the series resonance point up to an upper or lower limit of the variable range. $C_i(max)$ is a value of the electrostatic capacitance $C_{104}$ of the inner capacitor 104 at that time.

The variable inner capacitor 104 is connected to the inner coil 58, and a fixed or semi-fixed outer capacitor 88 is connected in series to the outer coil 62. By varying the electrostatic capacitance $C_{104}$ of the inner capacitor 104, the ratio of the inner coil current $I_i$ and the outer coil current $I_o$ is properly adjusted. Also, it is possible to properly control a profile of the plasma density distribution within the donut-shaped plasma generated directly under the RF antenna 54 (in particular, a balance of the central portion and the peripheral portion).

In accordance with a modified example, in order to positively or forcibly reduce the amount of the inner coil current $I_i$, a variable inductor 106 may be electrically connected in series to the inner coil 58 between the first node $N_A$ and the second node $N_B$. Also, it is possible to substitute the intermediate capacitor 86 with another variable inductor, or it is possible to omit the outer capacitor 88 for reducing costs.

Figure 9:
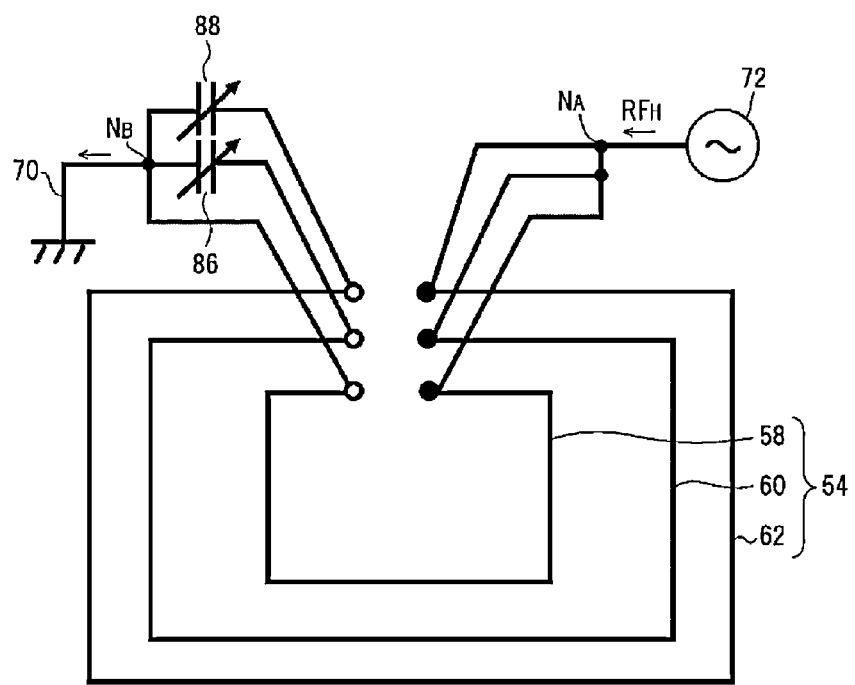
FIG. 9 is a diagram showing a basic configuration of a layout and an electric connection of a variable capacitor added in RF antenna in another experimental example.

The loop shape of each of the coils 58, 60, 62 in the RF antenna 54 is not limited to a circular shape. For example, as illustrated in FIG. 9, the loop shape of each of the coils 58, 60, 62 may be square according to the shape of the target object to be processed. When the loop shape of each of the coils 58, 60, 62 is polygonal, the variable intermediate capacitor 86 and the outer capacitor 88 may be electrically connected in series to the intermediate coil 60 and the outer coil 62, respectively, and no capacitor may be connected to the inner coil 58.

An inductance L of a rectangular coil, where lengths of two sides are represented as "a" and "b", and a thickness of the coil is represented as a radius "d", is expressed by the formula (6) below.

[Formula (6)]

$$L = \frac{\mu_0}{\pi}\left\{-a\log(a + \sqrt{a^2 + b^2}) - b\log(b + \sqrt{a^2 + b^2}) + (a+b)\log\frac{2ab}{d} + 2\sqrt{a^2+b^2} - \frac{7}{4}(a+b)\right\} \tag{6}$$

As shown from the formula (6), the inductance L of the rectangular coil is substantially proportional to the lengths of the two sides "a", "b". Accordingly, even when no capacitor is connected to the inner coil 58 as the same as in the circular coil, the plasma density distribution can be simply or easily controlled by the intermediate capacitor 86 and the outer capacitor 88.

Figure 10:
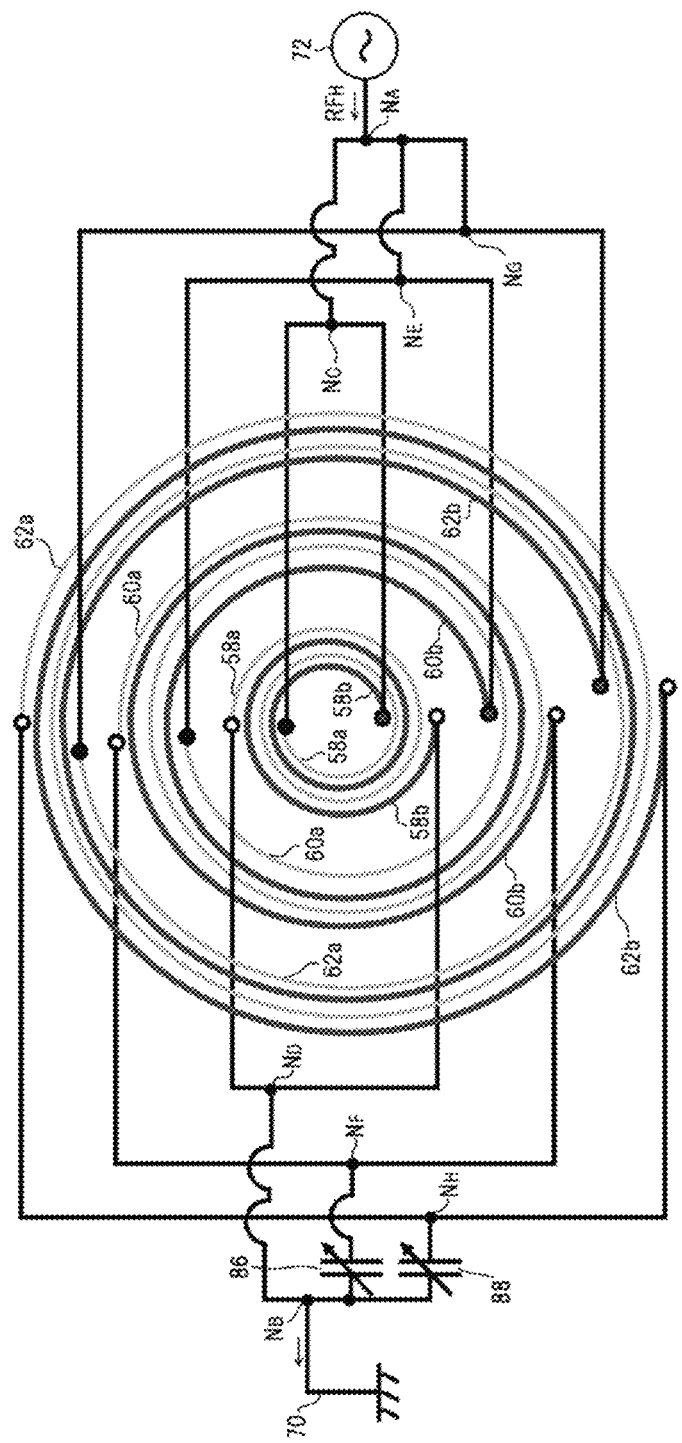
FIG. 10 is a diagram showing a basic configuration of a layout and an electric connection of a variable capacitor added in RF antenna in another experimental example.

FIG. 10 shows an example where the coils (inner coil 58/intermediate coil 60/outer coil 62) of the RF antenna 54 are formed with a pair of spiral coils. The coils are arranged in a spatially and electrically parallel. The spiral coils may be used unless the wavelength effect is really a problem.

In the illustrated configuration example, the inner coil 58 is formed with a pair of spiral coils 58a, 58b having a multiple number of turns (respectively, 2 turns in the illustrated example) and being deviated 180° from the circumferential direction. The spiral coils 58a, 58b are electrically connected in parallel between a node $N_C$ provided at a downstream side lower than the node $N_A$ of the high frequency power supply 72 and a node $N_D$ provided at an upstream side higher than the node $N_B$ of the earth line 70.

The intermediate coil 60 is formed with a pair of spiral coils 60a, 60b each having a multiple number of turns (respectively, 2 turns in the illustrated example) and being deviated 180° from the circumferential direction. The spiral coils 60a, 60b are electrically connected in parallel between a node $N_E$ provided at a downstream side lower than the node $N_A$ of the high frequency power supply 72 and a node $N_F$ provided at an upstream side higher than the node $N_B$ (and the intermediate capacitor 86) of the earth line 70.

The outer coil 62 is formed with a pair of spiral coils 62a, 62b each having a multiple number of turns (respectively, 2 turns in the illustrated example) and being deviated 180° from the circumferential direction. The spiral coils 62a, 62b are electrically connected in parallel between a node $N_G$ provided at a downstream side lower than the node $N_A$ of the high frequency power supply 72 and a node $N_H$ provided at an upstream side higher than the node $N_B$ (and the outer capacitor 88) of the earth line 70.

When the inner coil 58, the intermediate coil 60, and the outer coil 62 are segmented into $k_i$, $k_m$, and $k_o$ spiral coils in parallel, respectively, if no capacitor is connected to the RF antenna 54, a ratio of plasma densities $n_i$, $n_m$, $n_o$, which is generated directly under the coils 58, 60, 62, respectively, is expressed by an approximation equation (3) below.

$$n_i:n_m:n_o \approx (k_i/r_i):(k_m/r_i):(k_o/r_i) \quad (3)$$

As in the illustrated example, if the number of segments $k_i$, $k_m$, $k_o$ is the same (2 segments), the plasma density generated directly under the inner coil 58, i.e., the plasma in the central portion becomes relatively higher. In this case, the most desirable configuration is that no capacitor is connected to the inner coil 58, and the variable intermediate capacitor 86 and the outer capacitor 88 are connected in series to the intermediate coil 60 and the outer coil 62, respectively.

Figure 11:
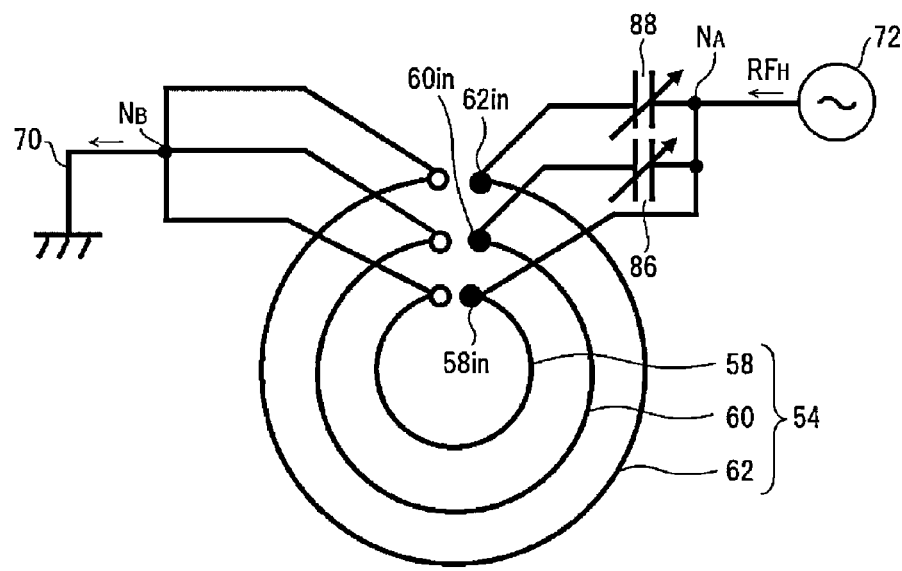
FIG. 11 is a diagram showing a basic configuration of a layout and an electric connection of a variable capacitor added in RF antenna in another experimental example.

With respect to another modified example, as illustrated in FIG. 11, it is possible to connect an intermediate capacitor 86 and an outer capacitor 88 between the first node $N_A$ of the high frequency power supply 72 and the RF inlet terminals 60in, 62in of the intermediate coil 60 and the outer coil 62. Connecting a capacitor or an inductor for adjusting impedance between the first node $N_A$ and each of the coils may be applied to another experimental example or another modified example (FIGS. 6A, 8, 9, and 10).

Figure 12:
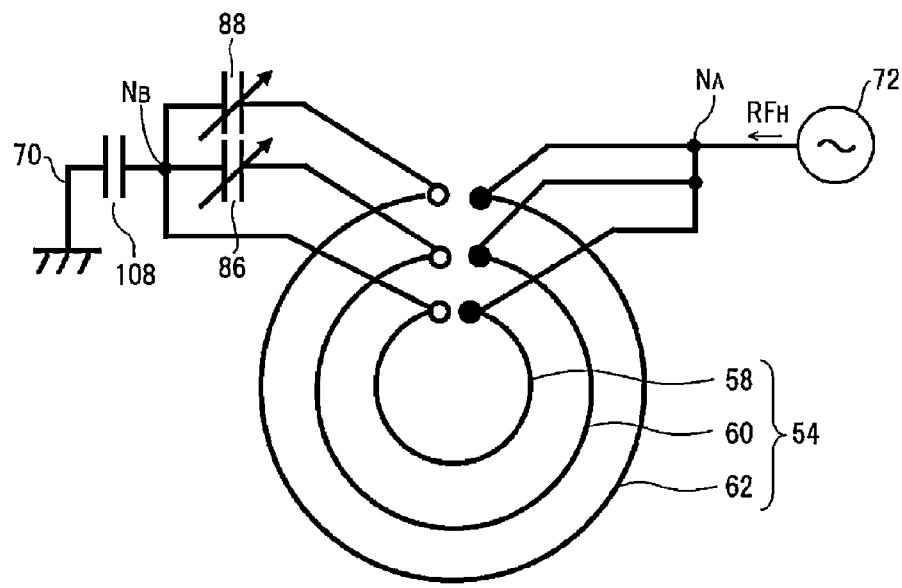
FIG. 12 is a diagram showing a basic configuration of a layout and an electric connection of a variable capacitor added in RF antenna in another experimental example.

FIG. 12 illustrates the configuration where an output common capacitor 108 is connected between the second node $N_B$ and the earth line 70 (or on the earth line 70) at the terminal end of the RF antenna 54, and electrically connected in series to all the coils 58, 60, 62 of the RF antenna 54. The output terminal (terminal end) common capacitor 108 may be a common fixed capacitor or a variable capacitor.

The output terminal (terminal end) common capacitor 108 has a function of adjusting the whole impedance of the RF antenna 54, and a function of suppressing ion sputter performed on the ceiling plate or the dielectric window 52 by serially raising the whole potential of the RF antenna 54 from a ground potential.

Although not illustrated herein, it is possible to provide other coils at the diametrical direction inner side of the inner coil 58 and/or the diametrical direction outer side of the outer coil 62 in the RF antenna 54. As a result, total 4 or more coils are arranged in the diametrical direction at intervals while being electrically connected in parallel to one another.

In the above-described embodiment, the illustrated configuration of the inductively coupled plasma etching apparatus is nothing more than an example. Not only each component of the plasma generating mechanism but also each component which is not directly relevant to plasma generation can be modified in various manners.

By way of example, the basic shape of the RF antenna may be a dome shape besides the planar shape mentioned above. Further, it may be also possible to have configuration in which a processing gas is introduced into the chamber 10 from the processing gas supply unit through a ceiling.

Furthermore, it may be also possible not to apply a high frequency power $RF_L$ for DC bias control to the susceptor 12.

The inductively coupled plasma processing apparatus or the inductively coupled plasma processing method of the present disclosure can be applied to, not limited to a plasma etching technology, other plasma processes such as plasma CVD, plasma oxidation, plasma nitridation, and sputtering. Further, the target substrate in the present disclosure may include, but is not limited to a semiconductor wafer, various kinds of substrates for a flat panel display or photo mask, a CD substrate, and a print substrate.

What is claimed is:

1. A plasma processing method for performing a plasma process on a processing target substrate by using a plasma processing apparatus having a processing chamber having a dielectric window; a substrate holding unit for holding thereon a processing target substrate within the processing chamber; a processing gas supply unit configured to supply a processing gas into the processing chamber in order to perform a plasma process on the processing target substrate; an RF antenna provided outside the dielectric window in order to generate plasma of the processing gas within the processing chamber by inductive coupling; and a high frequency power supply unit configured to supply a high frequency power having a frequency for generating a high frequency electric discharge of the processing gas in the RF antenna, the plasma processing method comprising:
    segmenting the RF antenna into an inner coil, an intermediate coil, and an outer coil with gaps therebetween in a radial direction, respectively, the inner coil, the intermediate coil and the outer coil being electrically connected to one another in parallel between a first node and a second node provided in high frequency transmission lines of the high frequency power supply unit;
    providing a variable intermediate capacitor and a variable outer capacitor between the first node and the second node, the variable intermediate capacitor being electrically connected in series to the intermediate coil, the variable outer capacitor being electrically connected in series to the outer coil, no reactance device being connected to the inner coil; and
    controlling plasma density distribution on the processing target substrate by selecting or variably adjusting electrostatic capacitances of the variable intermediate capacitor and the variable outer capacitor such that increased amounts of coil currents by the variable intermediate capacitor and the variable outer capacitor flow only in the intermediate coil and the outer coil,
    wherein when the number of windings of the inner coil and the number of windings of the outer coil are $N_i$ and $N_o$, respectively, an impedance of the inner coil is $Z_i$, and a maximum value and a minimum value of a combined impedance of the outer coil and the outer capacitor obtained by varying an electrostatic capacitance of the outer capacitor are $Z_o(max)$ and $Z_o(min)$, respectively, the following equation is established:

$$|N_o/Z_{o(max)}| < |N_i/Z_i| < |N_o/Z_{o(min)}|.$$

2. The plasma processing method of claim 1,
    wherein the current flowing in the inner coil is reduced by making at least one of electrostatic capacitances of the intermediate capacitor and the outer capacitor close to a value when a series resonance is generated.

3. The plasma processing method of claim 1,
wherein the current flowing in the inner coil is increased by making at least one of electrostatic capacitances of the intermediate capacitor and the outer capacitor apart from a value when a series resonance is generated.

4. The plasma processing method of claim 1,
wherein electrostatic capacitances of the intermediate capacitor and the outer capacitor are adjusted to enable plasma density on the processing target substrate to be uniformized in a diametrical direction.

5. The plasma processing method of claim 1,
wherein the plasma density on the processing target substrate is adjusted so as to be uniformized in the diametrical direction by conforming multiplication of the number of turns of each of the intermediate coil and the outer coil and an amount of a coil current thereof to multiplication of the number of turns of the inner coil and an amount of a coil current thereof.

6. The plasma processing method of claim 1,
wherein a direction of the current flowing in the intermediate coil is opposite to a direction of the current flowing in the inner coil in the circumferential direction by variably adjusting the electrostatic capacitance of the intermediate capacitor in a range smaller than a value when the intermediate capacitor and the intermediate coil generate a series resonance.

7. The plasma processing method of claim 1,
wherein a direction of the current flowing in the intermediate coil is identical to a direction of the current flowing in the inner coil in the circumferential direction by variably adjusting the electrostatic capacitance of the intermediate capacitor in a range larger than a value when the intermediate capacitor and the intermediate coil generate a series resonance.

8. The plasma processing method of claim 1,
wherein a direction of the current flowing in the outer coil is opposite to a direction of the current flowing in the inner coil in the circumferential direction by variably adjusting the electrostatic capacitance of the outer capacitor in a range smaller than a value when the outer capacitor and the outer coil generate a series resonance.

9. The plasma processing method of claim 1,
wherein a direction of the current flowing in the outer coil is identical to a direction of the current flowing in the inner coil in the circumferential direction by variably adjusting the electrostatic capacitance of the outer capacitor in a range larger than a value when the outer capacitor and the outer coil generate a series resonance.

* * * * *